United States Patent
Chang

(10) Patent No.: US 11,990,183 B2
(45) Date of Patent: May 21, 2024

(54) MEMORY SYSTEM WITH PHYSICAL UNCLONABLE FUNCTION

(71) Applicant: TAIWAN SEMICONDUCTOR MANUFACTURING COMPANY, LTD., Hsinchu (TW)

(72) Inventor: Meng-Sheng Chang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 119 days.

(21) Appl. No.: 17/710,442

(22) Filed: Mar. 31, 2022

(65) Prior Publication Data

US 2023/0317160 A1 Oct. 5, 2023

(51) Int. Cl.
*G11C 11/00* (2006.01)
*G11C 11/16* (2006.01)
*G11C 13/00* (2006.01)

(52) U.S. Cl.
CPC ...... *G11C 13/0069* (2013.01); *G11C 11/1655* (2013.01); *G11C 11/1675* (2013.01); *G11C 13/0026* (2013.01); *G11C 13/0004* (2013.01)

(58) Field of Classification Search
CPC .................................................. G11C 13/0002
USPC .......................................................... 365/148
See application file for complete search history.

(56) References Cited

U.S. PATENT DOCUMENTS 11,145,349 B1 * 10/2021 Pawlak .................. G06F 21/78
2017/0200508 A1 * 7/2017 Grigoriev ............. H04L 9/0866

* cited by examiner

*Primary Examiner* — Hoai V Ho
(74) *Attorney, Agent, or Firm* — Birch, Stewart, Kolasch & Birch, LLP

(57) ABSTRACT

A method includes: programming a first bit of a physical unclonable function into a first memory cell; and generating, by a first memory circuit in the first memory cell, a first current indicating a logic value of the first bit. The programming the first bit includes: turning on a first switch in the first memory circuit and at least one second switch in at least one second memory circuit in the first memory cell in response to a first bit line signal, to program one of the first memory circuit and the at least one second memory circuit while rest of the first memory circuit and the at least one second memory circuit is not programmed, according to the first bit line signal. A memory device and a system are also disclosed herein.

20 Claims, 8 Drawing Sheets

MEMORY SYSTEM WITH PHYSICAL UNCLONABLE FUNCTION

BACKGROUND

A physical unclonable function is used as an identifier of a semiconductor device. The physical unclonable function is most often based on unique physical variations which occur naturally during semiconductor manufacturing. The physical unclonable function is a physical entity embodied in a physical structure, such as a memory system. Today, physical unclonable functions are usually implemented in integrated circuits and are typically used in applications with high security requirements, including, for example, cryptography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
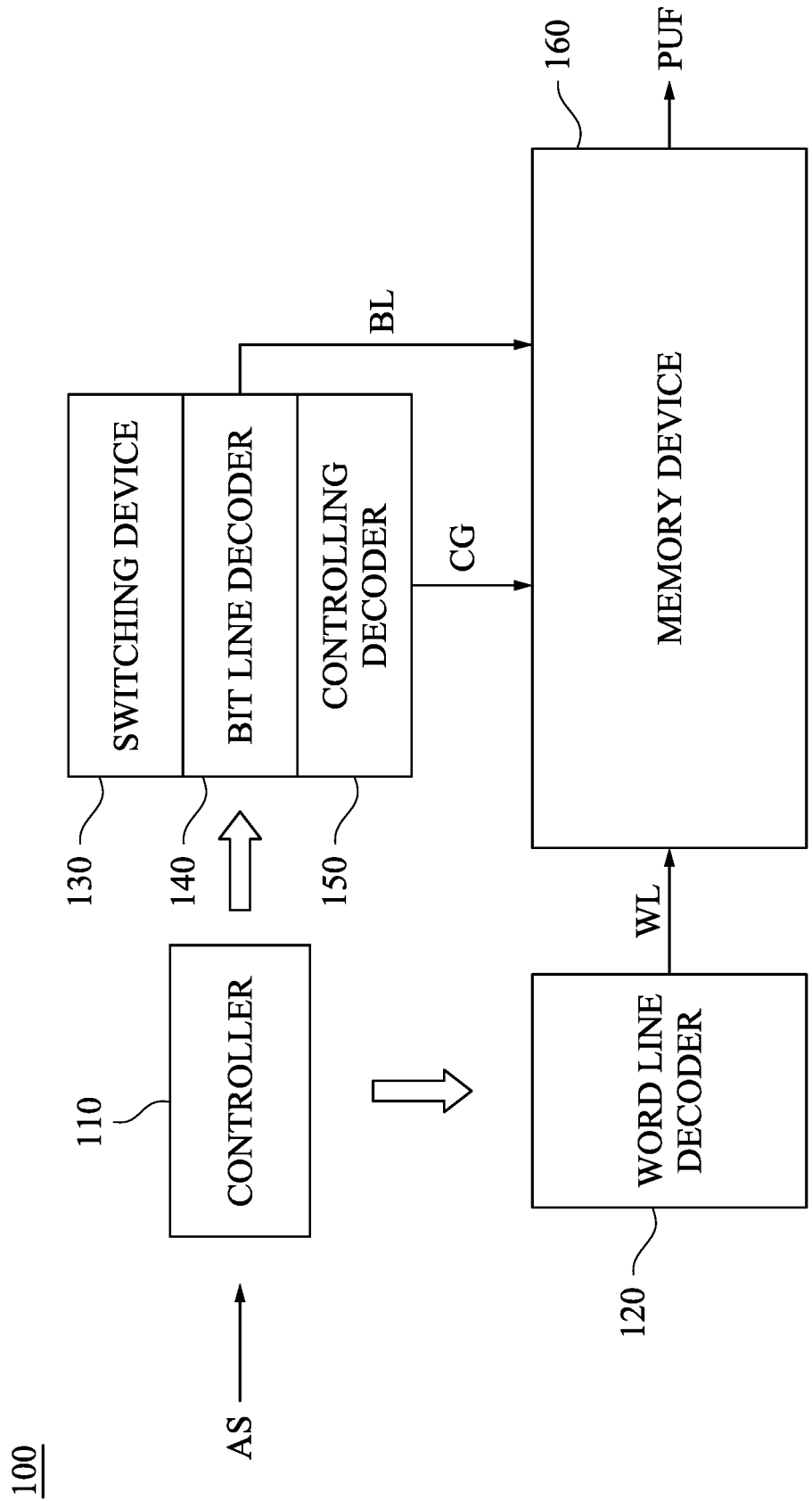
FIG. 1 is a schematic diagram of a system in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noted that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a system 100 in accordance with some embodiments of the present disclosure. As illustratively shown in FIG. 1, the system 100 includes a controller 110, a word line decoder 120, a switching device 130, a bit line decoder 140, a controlling decoder 150 and a memory device 160.

In some embodiments, the controller 110 is configured to control the word line decoder 120, the switching device 130, the bit line decoder 140 and the controlling decoder 150 according to an address signal AS. In some embodiments, the address signal AS corresponds to reading operations and/or programming operations for a memory cell (for example, one of memory cells 210, 220, 230 and 240 shown in FIG. 2) in the memory device 160.

In some embodiments, the word line decoder 120 is configured to provide word line signals WL to the memory device 160. The bit line decoder 140 is configured to provide bit line signals BL to the memory device 160. The controlling decoder 150 is configured to provide control signals CG to the memory device 160. In some embodiments, the switching device 130 is configured to adjust voltage levels of the bit line signals BL in response to the reading operations or programming operations for the memory cell.

Figure 2:
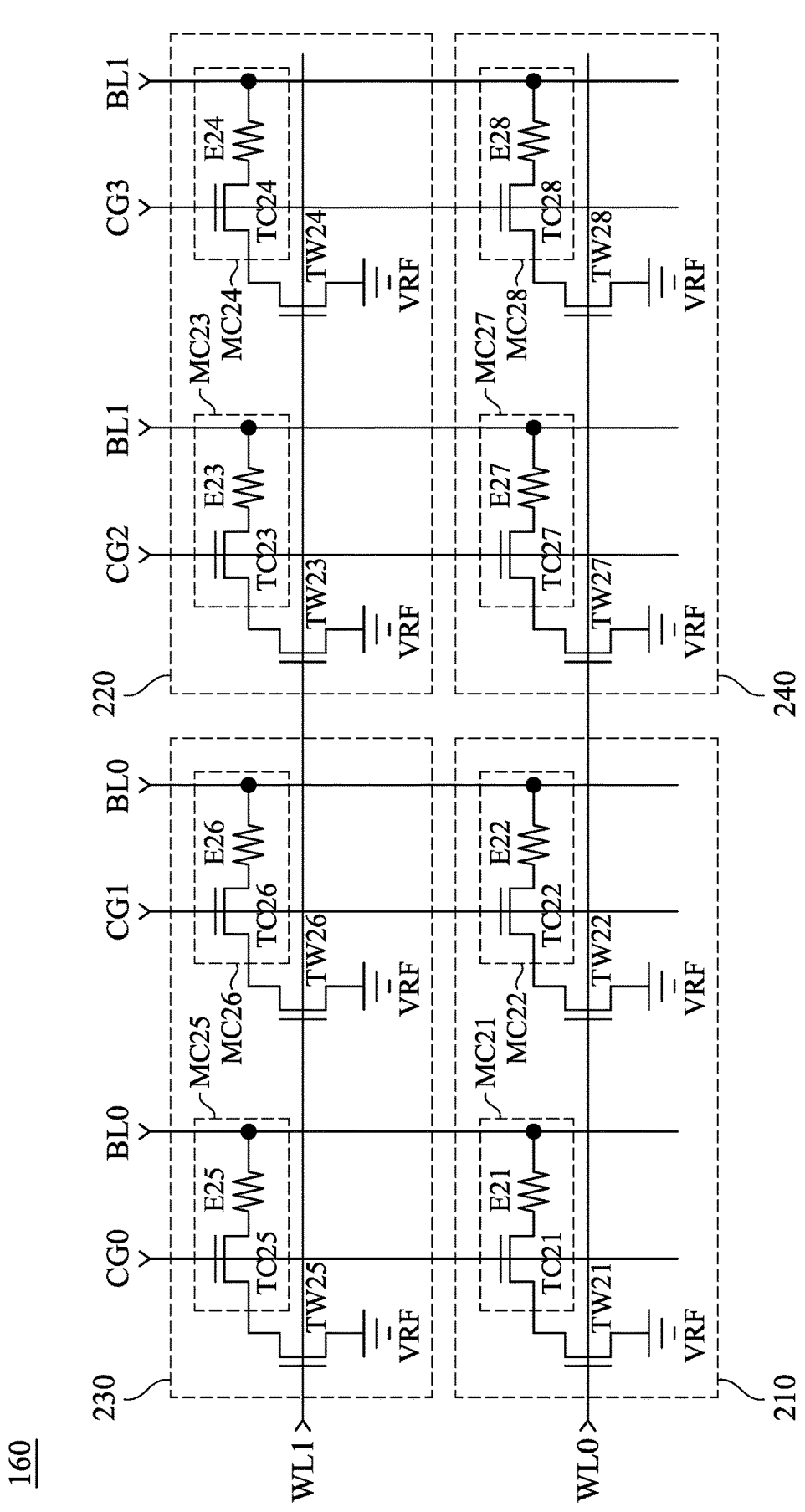
FIG. 2 is a schematic diagram of the memory device as illustrated in FIG. 1, in accordance with some embodiments of the present disclosure.

For example, the switching device 130 is configured to adjust a bit line signal BL0 shown in FIG. 2 to a programming voltage level PVL in response to a first programming operation, and adjust the bit line signal BL0 to a reading voltage level RVL in response to a first reading operation. For example, the switching device 130 is configured to adjust a bit line signal BL1 shown in FIG. 2 to the programming voltage level PVL in response to a second programming operation, and adjust the bit line signal BL1 to the reading voltage level RVL in response to a second reading operation.

In some embodiments, the memory device 160 is configured to generate a physical unclonable function PUF according to the word line signals WL, the bit line signals BL and the control signals CG. In some embodiments, the physical unclonable function PUF is used as an identifier of a semiconductor device, and indicates unique physical variations which occur naturally during semiconductor manufacturing. In some embodiments, the physical unclonable function PUF is a physical entity embodied in the system 100, and is able to be used in applications with high security requirements, including, for example, cryptography.

In various embodiments, the memory device 160 is implemented by various memory devices, such as a phase-change memory (PRAM, PCRAM), a resistive random access memory (RRAM), a magnetoresistive random access memory (RRAM), or the like.

FIG. 2 is a schematic diagram of the memory device 160 as illustrated in FIG. 1, in accordance with some embodiments of the present disclosure. For illustration of FIG. 2 with reference to FIG. 1, the word line signals WL0 and WL1 correspond to the word line signals WL, the control signals CG0-CG3 correspond to the control signals CG, and the bit line signals BL0 and BL1 correspond to the bit line signals BL. For example, in some embodiments, the word line decoder 120 is configured to generate the word line signals WL0 and WL1, the bit line decoder 140 is configured to generate the bit line signals BL0 and BL1, and the controlling decoder 150 is configured to generate the control signals CG0-CG3. Embodiments of the memory device 160 are not limited to the schematic diagram shown in FIG. 2. For example, in various embodiments, the memory device 160 is implemented by memory devices 400, 500, 600 or 700 shown in FIG. 4 to FIG. 7.

In some embodiments, the memory device 160 includes a number of memory cells. For example, as illustratively shown in FIG. 2, the memory device 160 includes memory cells 210, 220, 230 and 240. In some embodiments, the memory cells 210, 220, 230 and 240 are configured to store a first bit, a second bit, a third bit and a fourth bit of the physical unclonable function PUF shown in FIG. 1, respectively.

As illustratively shown in FIG. 2, the memory cell 210 is configured to receive a word line signal WL0, control signals CG0, CG1 and a bit line signal BL0. The memory cell 220 is configured to receive a word line signal WL1, control signals CG2, CG3 and a bit line signal BL1. The memory cell 230 is configured to receive the word line signal WL1, the control signals CG0, CG1 and the bit line signal BL0. The memory cell 240 is configured to receive the word line signal WL0, control signals CG2, CG3 and a bit line signal BL1.

In some embodiments, the memory cell 210 includes memory circuits MC21, MC22 and switches TW21, TW22. The memory circuit MC21 includes a switch TC21 and a memory element E21. The memory circuit MC22 includes a switch TC22 and a memory element E22.

As illustratively shown in FIG. 2, a control terminal of the switch TW21 is configured to receive the word line signal WL0, a first terminal of the switch TW21 is configured to receive a reference voltage signal VRF, and a second terminal of the switch TW21 is coupled to a first terminal of the switch TC21. A control terminal of the switch TC21 is configured to receive the control signal CG0, and a second terminal of the switch TC21 is coupled to a first terminal of the memory element E21. A second terminal of the memory element E21 is configured to receive the bit line signal BL0.

In some embodiments, a control terminal of the switch TW22 is configured to receive the word line signal WL0, a terminal of the switch TW22 is configured to receive the reference voltage signal VRF, and another terminal of the switch TW22 is coupled to a terminal of the switch TC22. In some embodiments, a control terminal of the switch TC22 is configured to receive the control signal CG1, the terminal of the switch TC22 is coupled to the switch TW22, and another terminal of the switch TC22 is coupled to a terminal of the memory element E22. In some embodiments, the terminal of the memory element E22 is coupled to the switch TC22, another terminal of the memory element E22 is configured to receive the bit line signal BL0.

As illustratively shown in FIG. 2, the memory cell 220 includes memory circuits MC23, MC24 and switches TW23, TW24. The memory circuit MC23 includes a switch TC23 and a memory element E23. The memory circuit MC24 includes a switch TC24 and a memory element E24.

In some embodiments, a control terminal of the switch TW23 is configured to receive the word line signal WL1, a terminal of the switch TW23 is configured to receive the reference voltage signal VRF, and another terminal of the switch TW23 is coupled to a terminal of the switch TC23. In some embodiments, a control terminal of the switch TC23 is configured to receive the control signal CG2, the terminal of the switch TC23 is coupled to the switch TW23, and another terminal of the switch TC23 is coupled to a terminal of the memory element E23. In some embodiments, the terminal of the memory element E23 is coupled to the switch TC23, another terminal of the memory element E23 is configured to receive the bit line signal BL1.

In some embodiments, a control terminal of the switch TW24 is configured to receive the word line signal WL1, a terminal of the switch TW24 is configured to receive the reference voltage signal VRF, and another terminal of the switch TW24 is coupled to a terminal of the switch TC24. In some embodiments, a control terminal of the switch TC24 is configured to receive the control signal CG3, the terminal of the switch TC24 is coupled to the switch TW24, and another terminal of the switch TC24 is coupled to a terminal of the memory element E24. In some embodiments, the terminal of the memory element E24 is coupled to the switch TC24, another terminal of the memory element E24 is configured to receive the bit line signal BL1.

As illustratively shown in FIG. 2, the memory cell 230 includes memory circuits MC25, MC26 and switches TW25, TW26. The memory circuit MC25 includes a switch TC25 and a memory element E25. The memory circuit MC26 includes a switch TC26 and a memory element E26.

In some embodiments, a control terminal of the switch TW25 is configured to receive the word line signal WL1, a terminal of the switch TW25 is configured to receive the reference voltage signal VRF, and another terminal of the switch TW25 is coupled to a terminal of the switch TC25. In some embodiments, a control terminal of the switch TC25 is configured to receive the control signal CG0, the terminal of the switch TC25 is coupled to the switch TW25, and another terminal of the switch TC25 is coupled to a terminal of the memory element E25. In some embodiments, the terminal of the memory element E25 is coupled to the switch TC25, another terminal of the memory element E25 is configured to receive the bit line signal BL0.

In some embodiments, a control terminal of the switch TW26 is configured to receive the word line signal WL1, a terminal of the switch TW26 is configured to receive the reference voltage signal VRF, and another terminal of the switch TW26 is coupled to a terminal of the switch TC26. In some embodiments, a control terminal of the switch TC26 is configured to receive the control signal CG1, the terminal of the switch TC26 is coupled to the switch TW26, and another terminal of the switch TC26 is coupled to a terminal of the memory element E26. In some embodiments, the terminal of the memory element E26 is coupled to the switch TC26, another terminal of the memory element E26 is configured to receive the bit line signal BL0.

As illustratively shown in FIG. 2, the memory cell 240 includes memory circuits MC27, MC28 and switches TW27, TW28. The memory circuit MC27 includes a switch TC27 and a memory element E27. The memory circuit MC28 includes a switch TC28 and a memory element E28.

In some embodiments, a control terminal of the switch TW27 is configured to receive the word line signal WL0, a terminal of the switch TW27 is configured to receive the reference voltage signal VRF, and another terminal of the switch TW27 is coupled to a terminal of the switch TC27. In some embodiments, a control terminal of the switch TC27 is configured to receive the control signal CG2, the terminal of the switch TC27 is coupled to the switch TW27, and another terminal of the switch TC27 is coupled to a terminal of the memory element E27. In some embodiments, the terminal of the memory element E27 is coupled to the switch TC27, another terminal of the memory element E27 is configured to receive the bit line signal BL1.

In some embodiments, a control terminal of the switch TW28 is configured to receive the word line signal WL0, a first terminal of the switch TW28 is configured to receive the reference voltage signal VRF, and a second terminal of the switch TW28 is coupled to a first terminal of the switch TC28. A control terminal of the switch TC28 is configured to receive the control signal CG3, and a second terminal of the switch TC28 is coupled to a first terminal of the memory element E28. A second terminal of the memory element E28 is configured to receive the bit line signal BL1.

In some embodiments, for programming the first bit of the physical unclonable function PUF into the memory cell 210, the first programming operation is performed. During the first programming operation, each of the word line signal WL0, the control signals CG0 and CG1 has an enable voltage level EVL to turn on the switches TW21, TW22, TC21 and TC22, and the bit line signal BL0 has a programming voltage level PVL to program one of the memory elements E21 and E22. In some embodiments, after one of the memory elements E21 and E22 is programmed, the first programming operation stops. For example, after the memory elements E21 is programmed, the bit line signal BL0 has a voltage level lower than the programming voltage level PVL, to stop the first programming operation. In some embodiments, only one of the memory elements E21 and E22 is programmed by the first programming operation. Alternatively stated, one of the memory elements E21 and E22 is programmed, and the other one of the memory elements E21 and E22 is not programmed after the first programming operation is performed. For example, the bit line signal BL0 having the programming voltage level PVL is applied to the memory circuits MC21 and MC22 simultaneously, to program one of the memory circuits MC21 and MC22.

In some embodiments, during the first programming operation, the word line signal WL1 and the control signals CG2 and CG3 have a disable voltage level DVL, and the reference voltage signal VRF has a ground voltage level GVL. In some embodiments, the disable voltage level DVL and the ground voltage level GVL are approximately equal to 0 volt, the programming voltage level PVL is approximately equal to 1.2-1.5 volt, and the enable voltage level EVL is approximately equal to 0.75 volt.

In some embodiments, during the first programming operation, a possibility of one of the memory circuits in the memory cell 210 being programmed is approximately equal to one divided by the number of the memory circuits in the memory cell 210. For example, the memory cell 210 includes two memory circuits MC21 and MC22 in the embodiments shown in FIG. 2. Accordingly, a possibility of one of the memory circuits MC21 and MC22 being programmed is approximately equal to one divided by two, which is fifty percent. In various embodiments, the memory cell 210 includes various numbers of the memory circuits, and has various possibilities for programming one of the memory circuits. Some embodiments with one memory cell including three memory circuits are described below with reference to FIG. 6. Some embodiments with one memory cell including four memory circuits are described below with reference to FIG. 7.

In some embodiments, before the first programming operation, each of the memory elements E21 and E22 is not programmed and has a first state corresponding to a first logic value, such as a logic value of 0. After the first programming operation, the programmed one of the memory elements E21 and E22 has a second state different from the first state, in which the second state corresponds to a second logic value, such as a logic value of 1. In other words, one of the memory elements E21 and E22 is configured to be programmed by the bit line signal BL0, to convert a state and a logic value of one of the memory elements E21 and E22. After the first programming operation, the memory elements E21 and E22 have states that are different from each other.

In some embodiments, the memory elements E21 and E22 are implemented by metal fuses. In such embodiments, one of the memory elements E21 and E22 having the first state has a low resistance, and the other one of the memory elements E21 and E22 having the second state has a high resistance. In various embodiments, the memory elements E21 and E22 are implemented by various fuse elements, such as vias, poly fuse, or the like.

In some embodiments, for programming the second bit of the physical unclonable function PUF into the memory cell 220, a second programming operation is performed. In some embodiments, the second programming operation is performed after the first programming operation is performed. During the second programming operation, each of the word line signal WL1, the control signals CG2 and CG3 has the enable voltage level EVL to turn on the switches TW23, TW24, TC23 and TC24, and the bit line signal BL1 has the programming voltage level PVL to program one of the memory elements E23 and E24. In some embodiments, after one of the memory elements E23 and E24 is programmed, the second programming operation stops. For example, after the memory elements E24 is programmed, the bit line signal BL1 has a voltage level lower than the programming voltage level PVL, to stop the second programming operation. In some embodiments, only one of the memory elements E23 and E24 is programmed by the second programming operation. Alternatively stated, one of the memory elements E23 and E24 is programmed, and the other one of the memory elements E23 and E24 is not programmed after the second programming operation is performed. For example, the bit line signal BL1 having the programming voltage level PVL is applied to the memory circuits MC23 and MC24 simultaneously, to program one of the memory circuits MC23 and MC24.

In some embodiments, during the second programming operation, the word line signal WL0 and the control signals CG0 and CG1 have the disable voltage level DVL, and the reference voltage signal VRF has the ground voltage level GVL.

In some embodiments, during the second programming operation, a possibility of one of the memory circuits in the memory cell 220 being programmed is approximately equal to one divided by the number of the memory circuits in the memory cell 220. For example, the memory cell 220 includes two memory circuits MC23 and MC24 in the embodiments shown in FIG. 2. Accordingly, a possibility of one of the memory circuits MC23 and MC24 being programmed is approximately equal to one divided by two, which is fifty percent.

Configurations of the second programming operation corresponding to the memory cell 220 and are similar with the configurations of the first programming operation corresponding to the memory cell 210. Therefore, some descriptions are not repeated for brevity.

In some embodiments, for programming the third bit of the physical unclonable function PUF into the memory cell 230, a third programming operation is performed. During the third programming operation, each of the word line signal WL1, the control signals CG0 and CG1 has the enable voltage level EVL to turn on the switches TW25, TW26, TC25 and TC26, and the bit line signal BL0 has the programming voltage level PVL to program one of the memory elements E25 and E26. In some embodiments, after one of the memory elements E25 and E26 is programmed, the third programming operation stops. For example, after the memory elements E26 is programmed, the bit line signal BL0 has a voltage level lower than the programming voltage level PVL, to stop the third programming operation. In some embodiments, only one of the memory elements E25 and E26 is programmed by the third programming operation.

In some embodiments, during the third programming operation, the word line signal WL0 and the control signals CG2 and CG3 have the disable voltage level DVL, and the reference voltage signal VRF has the ground voltage level GVL.

Configurations of the third programming operation corresponding to the memory cell 230 and are similar with the configurations of the first programming operation corresponding to the memory cell 210. Therefore, some descriptions are not repeated for brevity.

In some embodiments, for programming the fourth bit of the physical unclonable function PUF into the memory cell 240, a fourth programming operation is performed. During the fourth programming operation, each of the word line signal WL0, the control signals CG2 and CG3 has the enable voltage level EVL to turn on the switches TW27, TW28, TC27 and TC28, and the bit line signal BL1 has the programming voltage level PVL to program one of the memory elements E27 and E28. In some embodiments, after one of the memory elements E27 and E28 is programmed, the fourth programming operation stops. For example, after the memory elements E27 is programmed, the bit line signal BL1 has a voltage level lower than the programming voltage level PVL, to stop the fourth programming operation. In some embodiments, only one of the memory elements E27 and E28 is programmed by the fourth programming operation.

In some embodiments, during the fourth programming operation, the word line signal WL1 and the control signals CG0 and CG1 have the disable voltage level DVL, and the reference voltage signal VRF has the ground voltage level GVL.

Configurations of the fourth programming operation corresponding to the memory cell 240 are similar with the configurations of the first programming operation corresponding to the memory cell 210. Therefore, some descriptions are not repeated for brevity.

Figure 3:
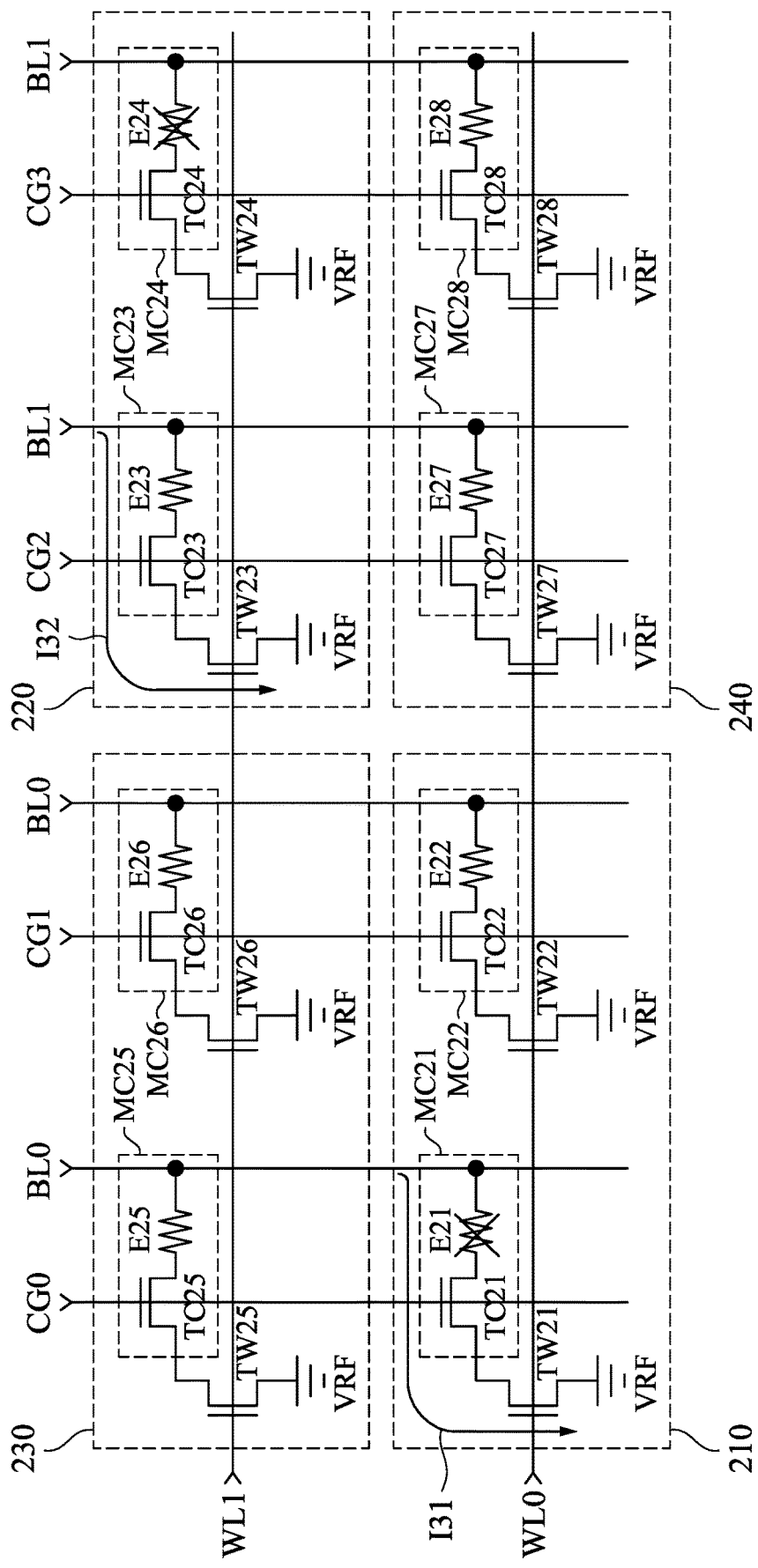
FIG. 3 is a schematic diagram of the memory device as illustrated in FIG. 1 after programming operations in accordance with some embodiments of the present disclosure.

FIG. 3 is a schematic diagram of the memory device 160 as illustrated in FIG. 1 after programming operations in accordance with some embodiments of the present disclosure. In some embodiments, FIG. 3 corresponds to the memory device 160 after the first programming operation and the second programming operation. As illustratively shown in FIG. 3, the memory element E21 and E24 are programmed and have the second state described above.

In some embodiments, after the first programming operation, the first reading operation is performed to read the first bit of the physical unclonable function PUF from the memory cell 210. During the first reading operation, each of the word line signal WL0 and the control signal CG0 has the enable voltage level EVL to turn on the switches TW21 and TC21, the bit line signal BL0 has a reading voltage level RVL, and the reference voltage signal VRF has the ground voltage level GVL. In some embodiments, the reading voltage level RVL is approximately 0.75 volt. Accordingly, the memory circuit MC21 generates a current 131 passing through the memory element E21, the switch TC21 and TW21 in order.

In the embodiment shown in FIG. 3, the switches TW21 and TC21 are implemented by n-type oxide semiconductor (NMOS) transistors. In some alternative embodiments, the switches TW21 and TC21 are implemented by p-type oxide semiconductor (PMOS) transistors. In such alternative embodiments, during the first reading operation, the reference voltage signal VRF has the reading voltage level RVL, the bit line signal BL0 has the ground voltage level GVL, and the current 131 is passing through the switch TW21, TC21 and the memory element E21 in order.

During the first reading operation, each of the word line signal WL1, the control signal CG1-CG3 has the disable voltage level DVL, and the bit line signal BL1 has the ground voltage level GVL. Accordingly, the memory circuits MC22-MC28 do not generate a current.

In the embodiment shown in FIG. 3, the memory element E21 is programmed during the first programming operation, the current 131 has a current level CL1 corresponding to the second state of the memory element E21. In a different embodiment, the memory element E22 is programmed during the first programming operation. Accordingly, the memory element E21 does not be programmed, and the current 131 has a current level CL2 corresponding to the first state of the memory element E21. In some embodiment, the memory element E21 has a higher resistance after being programmed, and has a lower resistance if not being programmed. Accordingly, the current level CL1 is lower than the current level CL2.

In summary, a current level of the current 131 indicates a state of the memory element E21, and the state of the memory element E21 corresponds to the logic value of the first bit of the physical unclonable function PUF. In other words, the current level of the current 131 indicates the logic value of the first bit of the physical unclonable function PUF. For example, when the current 131 has the current level CL1, the first bit of the physical unclonable function PUF has the logic value of 1, and when the current 131 has the current level CL2, the first bit of the physical unclonable function PUF has the logic value of 0.

In some approaches, a memory cell for storing a bit of a physical unclonable function only includes one memory element. Information of the bit can be obtained by observing a physical state of the memory element. Accordingly, security of the physical unclonable function is poor.

Compared to the above approaches, in some embodiments of the present disclosure, the memory cell 210 includes more memory elements, including, for example, two memory elements E21 and E22 having different states, as discussed above. It is hard to know which one of the memory elements E21 and E22 corresponds to the first bit of the physical unclonable function PUF by observing a physical state of the memory cell 210. As a result, the physical unclonable function PUF has good security.

With reference to FIG. 3 again, in some embodiments, after the second programming operation, a second reading operation is performed to read the second bit of the physical unclonable function PUF from the memory cell 220. During the second reading operation, each of the word line signal WL1 and the control signal CG2 has the enable voltage level EVL to turn on the switches TW23 and TC23, the bit line signal BL1 has the reading voltage level RVL, and the reference voltage signal VRF has the ground voltage level GVL. Accordingly, the memory circuit MC23 generates a current 132 passing through the memory element E23, the switch TC23 and TW23 in order.

In the embodiment shown in FIG. 3, the switches TW23 and TC23 are implemented by n-type oxide semiconductor (NMOS) transistors. In some alternative embodiments, the switches TW23 and TC23 are implemented by p-type oxide semiconductor (PMOS) transistors. In such alternative embodiments, during the first reading operation, the reference voltage signal VRF has the reading voltage level RVL, the bit line signal BL1 has the ground voltage level GVL, and the current 132 is passing through the switch TW23, TC23 and the memory element E23 in order.

During the second reading operation, each of the word line signal WL0, the control signal CG0, CG1 and CG3 has the disable voltage level DVL, and the bit line signal BL1 has the ground voltage level GVL. Accordingly, the memory circuits MC22-MC28 do not generate a current.

In the embodiment shown in FIG. 3, the memory element E23 is not programmed during the first programming operation, the current 132 has the current level CL2 corresponding to the first state of the memory element E23. In a different embodiment, the memory element E23 is programmed during the first programming operation. Accordingly, the current 132 has a current level CL1 corresponding to the second state of the memory element E23.

In summary, a current level of the current 132 indicates a state of the memory element E23, and the state of the memory element E23 corresponds to the logic value of the first bit of the physical unclonable function PUF. In other words, the current level of the current 132 indicates the logic value of the second bit of the physical unclonable function PUF. For example, when the current 132 has the current level CL1, the second bit of the physical unclonable function PUF has the logic value of 1, and when the current 132 has the current level CL2, the second bit of the physical unclonable function PUF has the logic value of 0.

In some embodiments, the memory device 160 includes more memory cells each including two memory circuits. In such embodiments, one of the two memory circuits is configured to receive a control signal CG(2K), and another one of the two memory circuits is configured to receive a control signal CG(2K+1). It is noted that K is a non-negative integer. In such embodiments, in response to reading operations being performed, the control signals CG(2K) have the enable voltage level EVL, and the control signals CG(2K+1) have the disable voltage level DVL, to generate current from the memory circuits receiving the control signals CG(2K).

Figure 4:
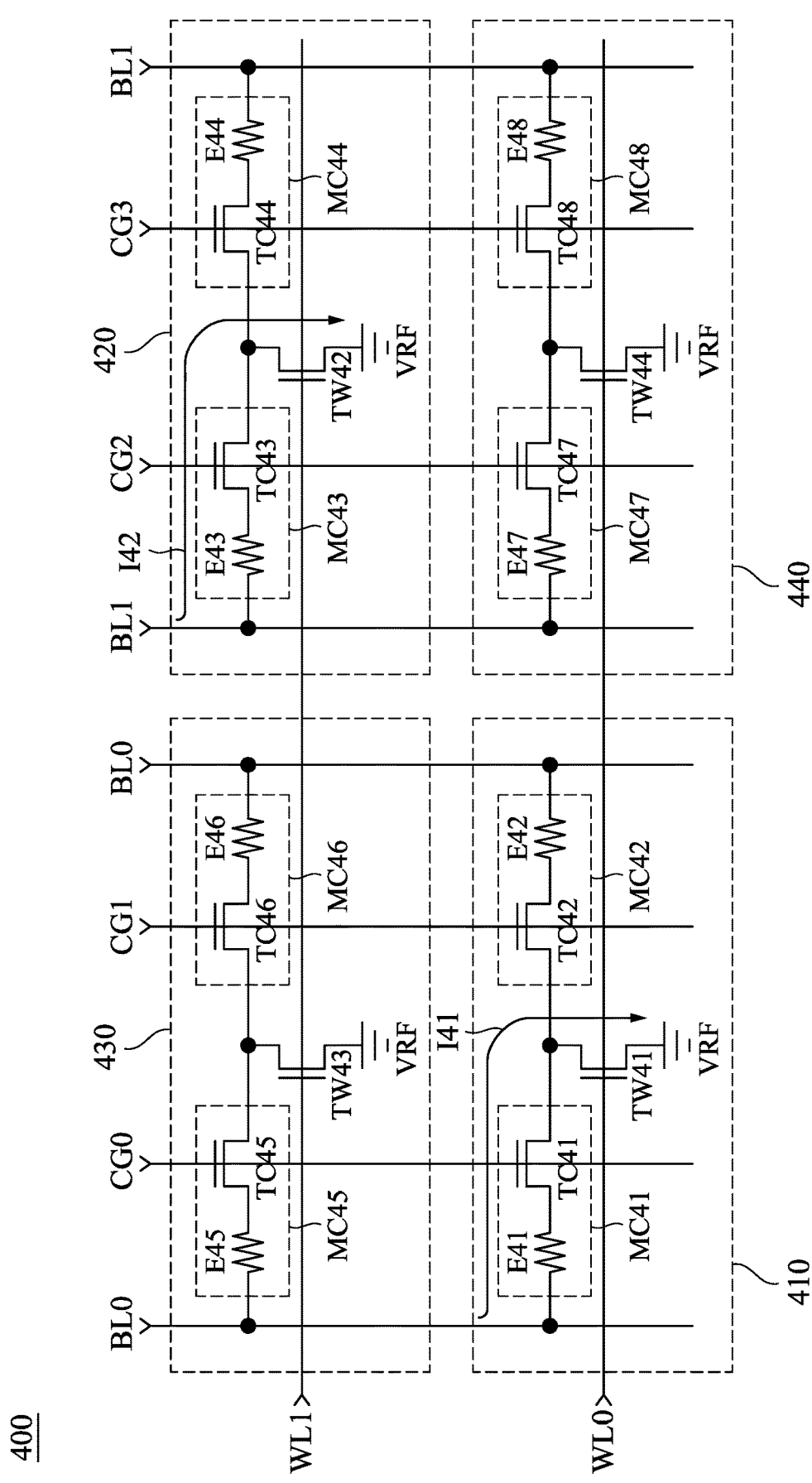
FIG. 4 is a schematic diagram of a memory device corresponding to the memory device as illustrated in FIG. 2 in accordance with some embodiments of the present disclosure.

FIG. 4 is a schematic diagram of a memory device 400 corresponding to the memory device 160 as illustrated in FIG. 2 in accordance with some embodiments of the present disclosure. For illustration of FIG. 4 with reference to FIG. 2, the memory device 400 is an alternative embodiment of the memory device 160. The memory cells 410, 420, 430 and 440 correspond to the memory cells 210, 220, 230 and 240, respectively. Therefore, some descriptions are not repeated for brevity.

In some embodiments, the memory device 400 includes a number of memory cells. For example, as illustratively shown in FIG. 4, the memory device 400 includes memory cells 410, 420, 430 and 440. In some embodiments, the memory cells 410, 420, 430 and 440 are configured to store the first bit, the second bit, the third bit and the fourth bit of the physical unclonable function PUF shown in FIG. 1, respectively.

As illustratively shown in FIG. 4, the memory cell 410 is configured to receive the word line signal WL0, the control signals CG0, CG1 and the bit line signal BL0. The memory cell 420 is configured to receive the word line signal WL1, the control signals CG2, CG3 and the bit line signal BL1. The memory cell 430 is configured to receive the word line signal WL1, the control signals CG0, CG1 and the bit line signal BL0. The memory cell 440 is configured to receive the word line signal WL0, control signals CG2, CG3 and a bit line signal BL1.

In some embodiments, the memory cell 410 includes memory circuits MC41, MC42 and switch TW41. The memory circuit MC41 includes a switch TC41 and a memory element E41. The memory circuit MC42 includes a switch TC42 and a memory element E42.

As illustratively shown in FIG. 4, a control terminal of the switch TW41 is configured to receive the word line signal WL0, a first terminal of the switch TW41 is configured to receive the reference voltage signal VRF, and a second terminal of the switch TW41 is coupled to a first terminal of the switch TC41 and a first terminal of the switch TC42. A control terminal of the switch TC41 is configured to receive the control signal CG0, and a second terminal of the switch TC41 is coupled to a first terminal of the memory element E41. A second terminal of the memory element E41 is configured to receive the bit line signal BL0.

In some embodiments, a control terminal of the switch TC42 is configured to receive the control signal CG1, and a second terminal of the switch TC42 is coupled to a first terminal of the memory element E42. A second terminal of the memory element E42 is configured to receive the bit line signal BL0.

As illustratively shown in FIG. 4, the memory cell 420 includes memory circuits MC43, MC44 and switch TW42. The memory circuit MC43 includes a switch TC43 and a memory element E43. The memory circuit MC44 includes a switch TC44 and a memory element E44.

In some embodiments, a control terminal of the switch TW42 is configured to receive the word line signal WL1, a first terminal of the switch TW42 is configured to receive the reference voltage signal VRF, and a second terminal of the switch TW42 is coupled to a first terminal of the switch TC43 and a first terminal of the switch TC44. In some embodiments, a control terminal of the switch TC43 is configured to receive the control signal CG2, and a second terminal of the switch TC43 is coupled to a first terminal of the memory element E43. A second terminal of the memory element E43 is configured to receive the bit line signal BL1.

In some embodiments, a control terminal of the switch TC44 is configured to receive the control signal CG3, a second terminal of the switch TC44 is coupled to a first terminal of the memory element E44. A second terminal of the memory element E44 is configured to receive the bit line signal BL1.

As illustratively shown in FIG. 4, the memory cell 430 includes memory circuits MC45, MC46 and switch TW43. The memory circuit MC45 includes a switch TC45 and a memory element E45. The memory circuit MC46 includes a switch TC46 and a memory element E46.

In some embodiments, a control terminal of the switch TW43 is configured to receive the word line signal WL1, a first terminal of the switch TW43 is configured to receive the reference voltage signal VRF, and a second terminal of the switch TW43 is coupled to a first terminal of the switch TC45 and a first terminal of the switch TC46. A control terminal of the switch TC45 is configured to receive the control signal CG0, a second terminal of the switch TC45 is coupled to a terminal of the memory element E45. A second terminal of the memory element E45 is configured to receive the bit line signal BL0.

In some embodiments, a control terminal of the switch TC46 is configured to receive the control signal CG1, a second terminal of the switch TC46 is coupled to a first terminal of the memory element E46. A second terminal of the memory element E46 is configured to receive the bit line signal BL0.

As illustratively shown in FIG. 4, the memory cell 440 includes memory circuits MC47, MC48 and switch TW44. The memory circuit MC47 includes a switch TC47 and a memory element E47. The memory circuit MC48 includes a switch TC48 and a memory element E48.

In some embodiments, a control terminal of the switch TW44 is configured to receive the word line signal WL0, a first terminal of the switch TW44 is configured to receive the reference voltage signal VRF, and a second terminal of the switch TW44 is coupled to a first terminal of the switch TC47 and a first terminal of the switch TC48. A control terminal of the switch TC47 is configured to receive the control signal CG2, a second terminal of the switch TC47 is coupled to a first terminal of the memory element E47. A second terminal of the memory element E47 is configured to receive the bit line signal BL1.

In some embodiments, a control terminal of the switch TC48 is configured to receive the control signal CG3, a second terminal of the switch TC48 is coupled to a terminal of the memory element E48. A second terminal of the memory element E48 is configured to receive the bit line signal BL1.

For illustration of FIG. 4 with reference to FIG. 2 and FIG. 3, the memory device 400 is an alternative embodiment of the memory device 160. Operations of the switches TC41-TC48 and the memory elements E41-E48 are similar with the operations of the switches TC21-TC28 and the memory elements E21-E28, respectively. The switch TW41 corresponds to the switches TW21 and TW22, the switch TW42 corresponds to the switches TW23 and TW24, the switch TW43 corresponds to the switches TW25 and TW26, and the switch TW44 corresponds to the switches TW27 and TW28. Therefore, some descriptions are not repeated for brevity.

During the first programming operation, one of the memory elements E41 and E42 is programmed in response to applying the bit line signal BL0 having the programming voltage level PVL to the memory circuits MC41 and MC42 simultaneously. The probability of each of the memory elements E41 and E42 being programmed is approximately fifty percent. In some embodiments, only one of the memory elements E41 and E42 is programmed by the first programming operation.

During the first reading operation, the memory circuit MC41 is configured to generate a current 141 passing through the memory element E41 and switches TC41, TW41. In some embodiments, a current level of the current 141 indicates the logic value of the first bit of the physical unclonable function PUF.

During the second programming operation, one of the memory elements E43 and E44 is programmed in response to applying the bit line signal BL1 having the programming voltage level PVL to the memory circuits MC43 and MC44 simultaneously. The probability of each of the memory elements E43 and E44 being programmed is approximately fifty percent. In some embodiments, only one of the memory elements E43 and E44 is programmed by the second programming operation.

During the second reading operation, the memory circuit MC43 is configured to generate a current 142 passing through the memory element E43 and switches TC43, TW42. In some embodiments, a current level of the current 142 indicates the logic value of the second bit of the physical unclonable function PUF.

For illustration of FIG. 4 with reference to FIG. 3, configurations of the currents 141 and 142 are similar with the configurations of the currents 131 and 132, respectively. Therefore, some descriptions are not repeated for brevity. In some embodiments, the memory elements E41-E48 are implemented by metal fuses.

Figure 5:
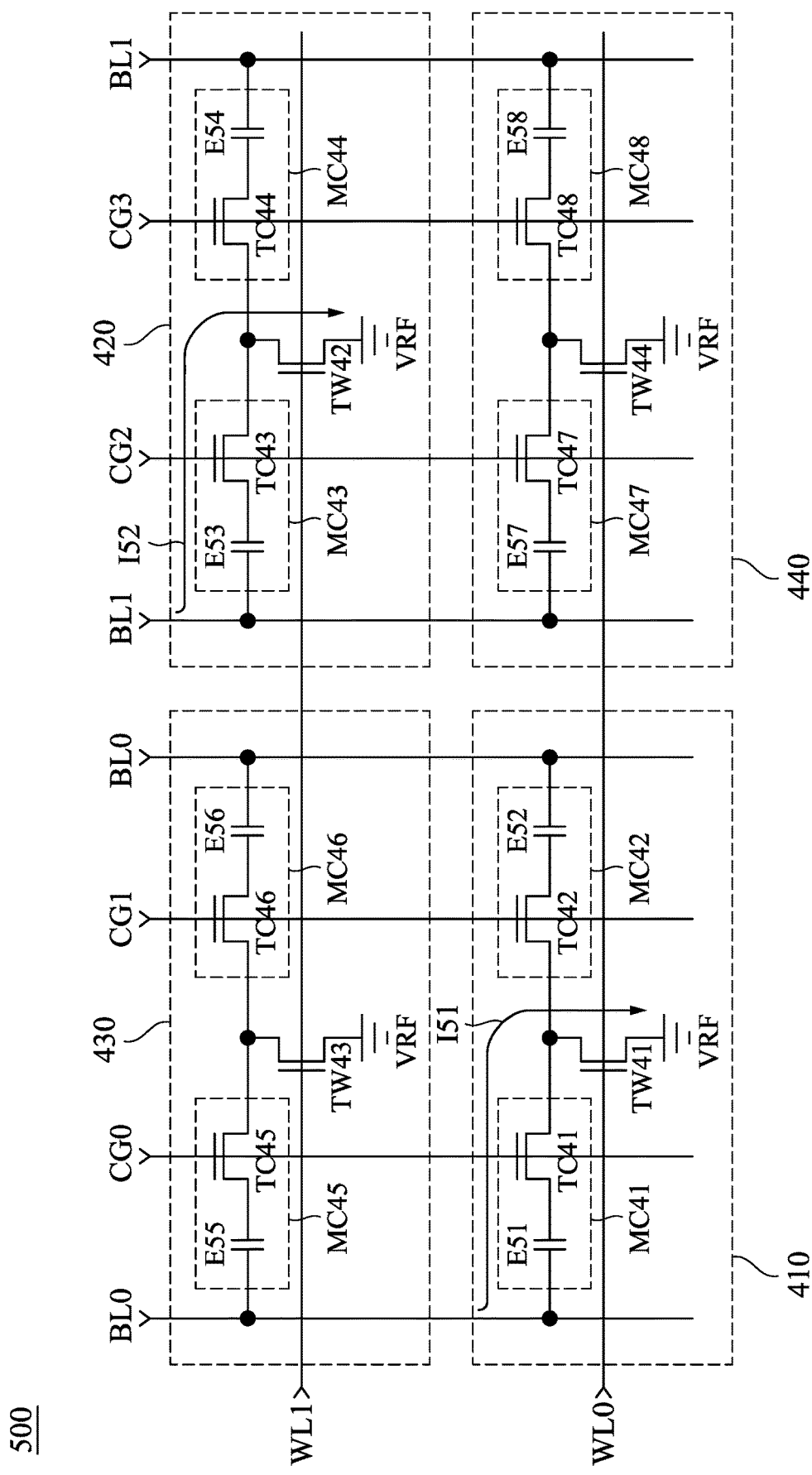
FIG. 5 is a schematic diagram of a memory device corresponding to the memory device as illustrated in FIG. 4, in accordance with some embodiments of the present disclosure.

FIG. 5 is a schematic diagram of a memory device 500 corresponding to the memory device 400 as illustrated in FIG. 4, in accordance with some embodiments of the present disclosure. For illustration of FIG. 5 with reference to FIG. 4, the memory device 500 is an alternative embodiment of the memory device 400. FIG. 5 follows a similar labeling convention to that of FIG. 4. For brevity, the discussion will focus more on differences between FIG. 4 and FIG. 5 than on similarities.

As illustratively shown in FIG. 5, the memory elements E41-E48 shown in FIG. 4 are replaced by memory elements E51-E58. The memory elements E51-E58 are alternative embodiments of the memory elements E41-E48, respectively. Therefore, some descriptions are not repeated for brevity. In some embodiments, the memory elements E51-E58 are implemented by capacitors. In various embodiments, the memory elements E51-E58 are implemented by various anti-fuse elements, such as metal capacitors, oxide capacitors, or the like.

In some embodiments, the memory elements E51-E58 have anti-fuse properties. In other words, the memory elements E51-E58 have a low resistance in response to being programmed, and have a high resistance in response to not being programmed.

During the first reading operation, a current 151 passing through the memory elements E51, the switches TC41 and TW41 is generated. In response to the memory element E51 being programmed, the first bit of the physical unclonable function PUF has a logic value 0, and the current 151 has a high current level, such as the current level CL2. In response to the memory element E52 being programmed, the memory element E51 is not programmed, the first bit of the physical unclonable function PUF has a logic value 1, and the current 151 has a lower current level, such as the current level CL1.

During the second reading operation, a current 152 passing through the memory elements E53, the switches TC43 and TW42 is generated. In response to the memory element E53 being programmed, the second bit of the physical unclonable function PUF has a logic value of 0, and the current 152 has a high current level, such as the current level CL2. In response to the memory element E54 being programmed, the memory element E53 is not programmed, the second bit of the physical unclonable function PUF has a logic value of 1, and the current 152 has a lower current level, such as the current level CL1.

Figure 6:
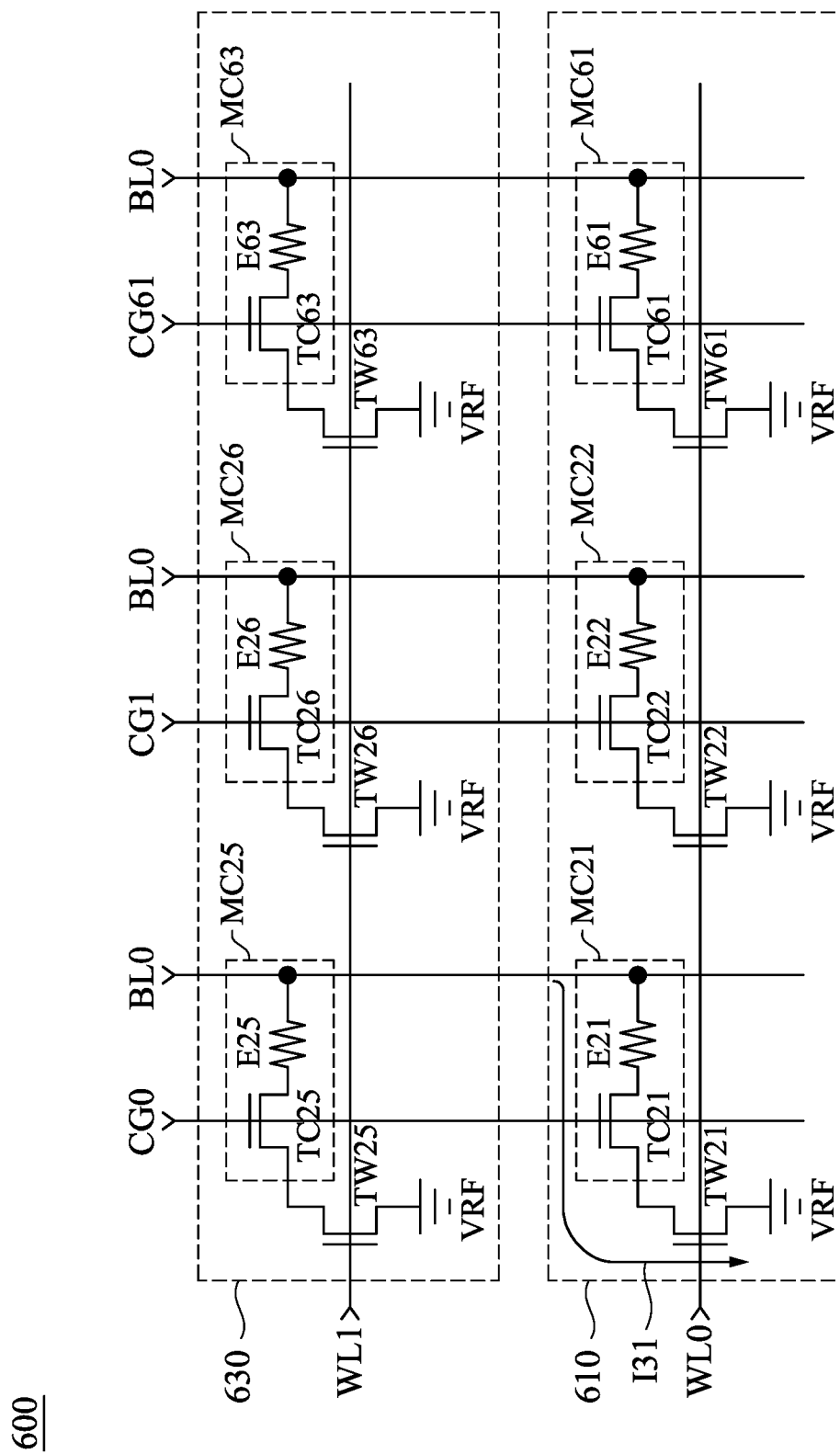
FIG. 6 is a schematic diagram of a memory device corresponding to the memory device as illustrated in FIG. 2, in accordance with some embodiments of the present disclosure.

FIG. 6 is a schematic diagram of a memory device 600 corresponding to the memory device 160 as illustrated in FIG. 2, in accordance with some embodiments of the present disclosure. For illustration of FIG. 6 with reference to FIG. 2, the memory device 600 is an alternative embodiment of the memory device 160. FIG. 6 follows a similar labeling convention to that of FIG. 2. For brevity, the discussion will focus more on differences between FIG. 2 and FIG. 6 than on similarities.

As illustratively shown in FIG. 6, the memory device 600 includes memory cells 610 and 630. The memory cell 610 includes the switches TW21, TW22 and the memory circuits MC21, MC22. The memory cell 630 includes the switches TW25, TW26 and the memory circuits MC25, MC26. The descriptions of the switches TW21, TW22, TW25, TW26 and the memory circuits MC21, MC22, MC25, MC26 are described above with the embodiments associated with FIG. 2, and thus not repeated for brevity.

In some embodiments, the memory cell 610 further includes a switch TW61 and a memory circuit MC61. The memory circuit MC61 includes a switch TC61 and a memory element E61.

As illustratively shown in FIG. 6, a control terminal of the switch TW61 is configured to receive the word line signal WL0, a first terminal of the switch TW61 is configured to receive the reference voltage signal VRF, and a second terminal of the switch TW61 is coupled to a first terminal of the switch TC61. A control terminal of the switch TC61 is configured to receive a control signal CG61, and a second terminal of the switch TC61 is coupled to a first terminal of the memory element E61. A second terminal of the memory element E61 is configured to receive the bit line signal BL0.

In some embodiments, the memory cell 630 further includes a switch TW63 and a memory circuit MC63. The memory circuit MC63 includes a switch TC63 and a memory element E63.

As illustratively shown in FIG. 6, a control terminal of the switch TW63 is configured to receive the word line signal WL1, a first terminal of the switch TW63 is configured to receive the reference voltage signal VRF, and a second terminal of the switch TW63 is coupled to a first terminal of the switch TC63. In some embodiments, a control terminal of the switch TC63 is configured to receive a control signal CG61, and a second terminal of the switch TC63 is coupled to a first terminal of the memory element E63. A second terminal of the memory element E63 is configured to receive the bit line signal BL0.

During the first programming operation, each of the word line signal WL0, the control signals CG0, CG1 and CG61 has the enable voltage level EVL to turn on the switches TW21, TW22, TC21, TC22, TW61 and TC61, and the bit line signal BL0 has a programming voltage level PVL to program one of the memory elements E21, E22 and E61. In some embodiments, after one of the memory elements E21, E22 and E61 is programmed, the first programming operation stops. In some embodiments, only one of the memory elements E21, E22 and E61 is programmed by the first programming operation. In some embodiments, in response to one of the memory elements E21, E22 and E61 is programmed, other ones of the memory elements E21, E22 and E61 are not programmed.

In the embodiment shown in FIG. 6, during the first programming operation, a possibility of each of the memory elements E21, E22 and E61 being programmed is approximately one-third, in response to the memory cell 610 including three memory elements E21, E22 and E61 receiving the bit line signal BL0.

During the first reading operation, each of the word line signal WL0 and the control signal CG0 has the enable voltage level EVL to turn on the switches TW21 and TC21, the bit line signal BL0 has the reading voltage level RVL, and each of the reference voltage signal VRF, the control signals CG1 and CG61 has the ground voltage level GVL. Accordingly, the memory circuit MC21 generates the current 131. The descriptions of the current 131 are described above with the embodiments associated with FIG. 3, and thus not repeated for brevity.

During the third programming operation, each of the word line signal WL1, the control signals CG0, CG1 and CG61 has the enable voltage level EVL to turn on the switches TW25, TW26, TC25, TC26, TW63 and TC63, and the bit line signal BL0 has a programming voltage level PVL to program one of the memory elements E25, E26 and E63. In some embodiments, after one of the memory elements E25, E26 and E63 is programmed, the third programming operation stops. In some embodiments, only one of the memory elements E25, E26 and E63 is programmed by the third programming operation. In some embodiments, in response to one of the memory elements E25, E26 and E63 is programmed, other ones of the memory elements E25, E26 and E63 are not programmed.

In the embodiment shown in FIG. 6, during the third programming operation, a possibility of each of the memory elements E25, E26 and E63 being programmed is approximately one-third, in response to the memory cell 630 including three memory elements E25, E26 and E63 receiving the bit line signal BL0.

Figure 7:
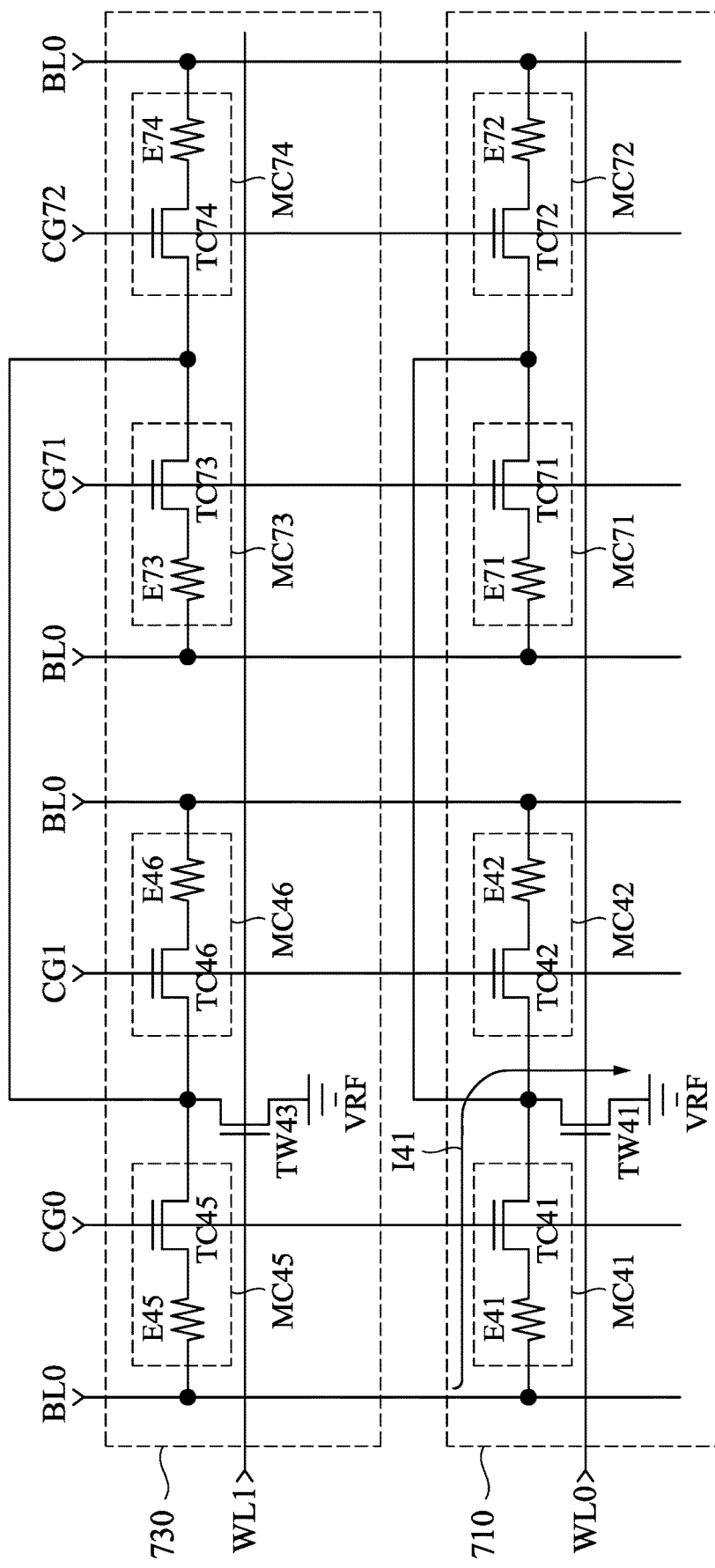
FIG. 7 is a schematic diagram of a memory device corresponding to the memory device as illustrated in FIG. 4, in accordance with some embodiments of the present disclosure.

FIG. 7 is a schematic diagram of a memory device 700 corresponding to the memory device 400 as illustrated in FIG. 4, in accordance with some embodiments of the present disclosure. For illustration of FIG. 7 with reference to FIG. 4, the memory device 700 is an alternative embodiment of the memory device 400. FIG. 7 follows a similar labeling convention to that of FIG. 4. For brevity, the discussion will focus more on differences between FIG. 4 and FIG. 7 than on similarities.

As illustratively shown in FIG. 7, the memory device 700 includes memory cells 710 and 730. The memory cell 710 includes the switch TW41 and the memory circuits MC41, MC42. The memory cell 730 includes the switch TW43 and the memory circuits MC45, MC46. The descriptions of the switches TW41, TW43 and the memory circuits MC41, MC42, MC45, MC46 are described above with the embodiments associated with FIG. 4, and thus not repeated for brevity.

As illustratively shown in FIG. 7, the memory cell 710 further includes a memory circuits MC71 and MC72. The memory circuit MC71 includes a switch TC71 and a memory element E71. The memory circuit MC72 includes a switch TC72 and a memory element E72.

In some embodiments, a control terminal of the switch TC71 is configured to receive a control signal CG71, a first terminal of the switch TC71 is coupled to the switch TW41, and a second terminal of the switch TC71 is coupled to a first terminal of the memory element E71. A second terminal of the memory element E71 is configured to receive the bit line signal BL0.

In some embodiments, a control terminal of the switch TC72 is configured to receive a control signal CG72, a first terminal of the switch TC72 is coupled to the switch TW41, and a second terminal of the switch TC72 is coupled to a first terminal of the memory element E72. A second terminal of the memory element E72 is configured to receive the bit line signal BL0.

As illustratively shown in FIG. 7, the memory cell 730 further includes a memory circuits MC73 and MC74. The memory circuit MC73 includes a switch TC73 and a memory element E73. The memory circuit MC74 includes a switch TC74 and a memory element E74.

In some embodiments, a control terminal of the switch TC73 is configured to receive a control signal CG71, a first terminal of the switch TC73 is coupled to the switch TW43, and a second terminal of the switch TC73 is coupled to a first terminal of the memory element E73. A second terminal of the memory element E73 is configured to receive the bit line signal BL0.

In some embodiments, a control terminal of the switch TC74 is configured to receive a control signal CG72, a first terminal of the switch TC74 is coupled to the switch TW43, and a second terminal of the switch TC74 is coupled to a first terminal of the memory element E74. A second terminal of the memory element E74 is configured to receive the bit line signal BL0.

During the first programming operation, each of the word line signal WL0, the control signals CG0, CG1, CG71 and CG72 has the enable voltage level EVL to turn on the switches TW41, TC41, TC42, TC71 and TC72, and the bit line signal BL0 has a programming voltage level PVL to program one of the memory elements E41, E42, E71 and E72. In some embodiments, after one of the memory elements E41, E42, E71 and E72 is programmed, the first programming operation stops. In some embodiments, only one of the memory elements E41, E42, E71 and E72 is programmed by the first programming operation. In some embodiments, in response to one of the memory elements E41, E42, E71 and E72 is programmed, other ones of the memory elements E41, E42, E71 and E72 are not programmed.

In the embodiment shown in FIG. 7, during the first programming operation, a possibility of each of the memory elements E41, E42, E71 and E72 being programmed is approximately one-fourth, in response to the memory cell 710 including four memory elements E41, E42, E71 and E72 receiving the bit line signal BL0.

During the first reading operation, each of the word line signal WL0 and the control signal CG0 has the enable voltage level EVL to turn on the switches TW41 and TC41, the bit line signal BL0 has the reading voltage level RVL, and each of the reference voltage signal VRF, the control signals CG1, CG71 and CG72 has the ground voltage level GVL. Accordingly, the memory circuit MC41 generates the current 141. The descriptions of the current 141 are described above with the embodiments associated with FIG. 4, and thus not repeated for brevity.

During the third programming operation, each of the word line signal WL1, the control signals CG0, CG1, CG71 and CG72 has the enable voltage level EVL to turn on the switches TW45, TC45, TC46, TC75 and TC76, and the bit line signal BL0 has a programming voltage level PVL to program one of the memory elements E45, E46, E75 and E76. In some embodiments, after one of the memory elements E45, E46, E75 and E76 is programmed, the third programming operation stops. In some embodiments, only one of the memory elements E45, E46, E75 and E76 is programmed by the third programming operation. In some embodiments, in response to one of the memory elements E45, E46, E75 and E76 is programmed, other ones of the memory elements E45, E46, E75 and E76 are not programmed.

In the embodiment shown in FIG. 7, during the third programming operation, a possibility of each of the memory elements E45, E46, E75 and E76 being programmed is approximately one-fourth, in response to the memory cell 730 including four memory elements E45, E46, E75 and E76 receiving the bit line signal BL0.

In various embodiments, the system 100 and the memory devices 160, 400, 500, 600 and 700 are manufactured by various semiconductor processes, such as a nanosheet process, a gate-all-around (GAA) process, a fin field-effect transistor (FinFET) process and a planner process. In some embodiments, for the nanosheet process and the FinFET process, the gate oxide is weak in reliability. Accordingly, the nanosheet process and the FinFET process are good in cascade structures.

Figure 8A:
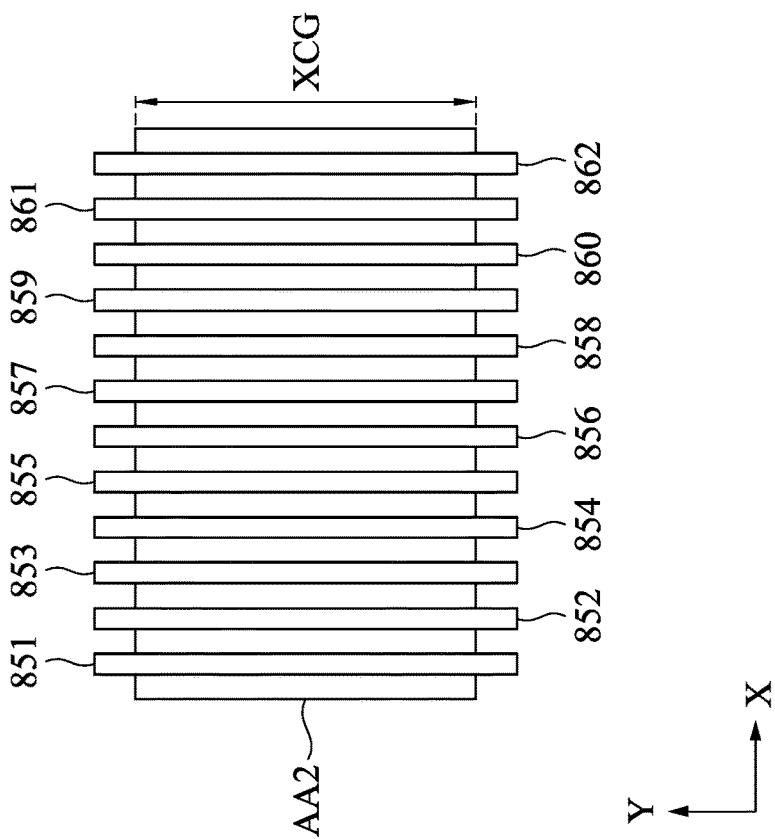
FIG. 8A is a layout diagram of the memory device shown in FIG. 2 in accordance with some embodiments of the present disclosure.

FIG. 8A is a layout diagram 800A of the memory device 160 shown in FIG. 2 in accordance with some embodiments of the present disclosure. In some embodiments, the layout diagram 800A corresponds to a part of the memory device 160. As illustratively shown in FIG. 8A, the layout diagram 800A includes gates 801-812 and an active area AA1. The gates 801-812 cross over the active area AA1 in a Y-direction. The active area AA1 extends in an X-direction different from the Y direction, and has a width XWL in the Y-direction. In some embodiments, the Y-direction and the X-direction are perpendicular with each other.

For illustration of FIG. 8A with reference to FIG. 2, the control terminals of the switches TW21-TW28 are implemented by at least a part of the gates 801-812.

Figure 8B:
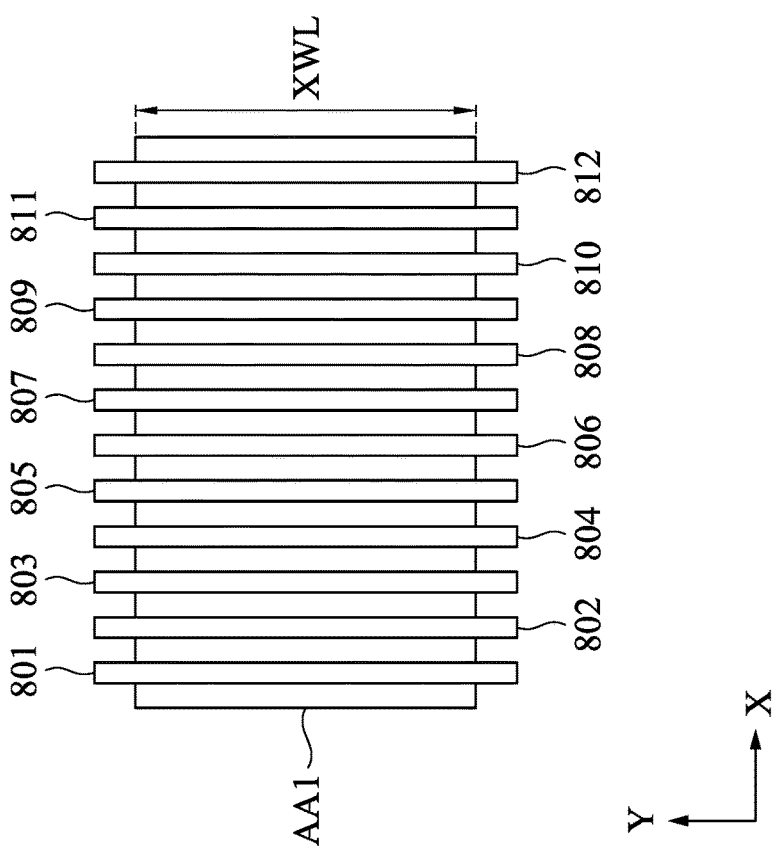
FIG. 8B is a layout diagram 800B of the memory device shown in FIG. 2 in accordance with some embodiments of the present disclosure.

FIG. 8B is a layout diagram 800B of the memory device 160 shown in FIG. 2 in accordance with some embodiments of the present disclosure. In some embodiments, the layout diagram 800B corresponds to a part of the memory device 160. As illustratively shown in FIG. 8B, the layout diagram 800B includes gates 851-862 and an active area AA2. The gates 851-862 cross over the active area AA2 in the Y-direction. The active area AA2 extends in the X-direction, and has a width XCG in the Y-direction.

For illustration of FIG. 8B with reference to FIG. 2, the control terminals of the switches TC21-TC28 are implemented by at least a part of the gates 851-862.

For illustration of FIG. 8B with reference to FIG. 8A, a number of gates 851-862 is same as a number of gates 801-812, and the width XWL is same as the width XCG. In various embodiments, the number of gates 851-862 is larger than or smaller than the number of gates 801-812. In various embodiments, the width XWL is larger than or smaller than the width XCG.

Also disclosed is a method. The method includes: programming a first bit of a physical unclonable function into a first memory cell; and generating, by a first memory circuit in the first memory cell, a first current indicating a logic value of the first bit. The programming the first bit includes: turning on a first switch in the first memory circuit and at least one second switch in at least one second memory circuit in the first memory cell in response to a first bit line signal, to program one of the first memory circuit and the at least one second memory circuit while rest of the first memory circuit and the at least one second memory circuit is not programmed, according to the first bit line signal.

Also disclosed is a memory device. The memory device includes a first memory cell. The first memory cell is configured to store a first bit of a physical unclonable function. The first memory cell includes a first memory circuit and a second memory circuit. The first memory circuit is configured to receive a first bit line signal. The second memory circuit is configured to receive the first bit line signal. In response to the first memory circuit being programmed by the first bit line signal, the first bit has a first logic value, and in response to the second memory circuit being programmed by the first bit line signal, the first bit has a second logic value different from the first logic value.

Also disclosed is a system. The system includes a first memory cell, a second memory cell, a bit line decoder and a switching device. The first memory cell includes a plurality of first memory circuits. The second memory cell includes a plurality of second memory circuits. The bit line decoder is configured to provide a first bit line signal to each of the plurality of first memory circuits, and provide a second bit line signal to each of the plurality of second memory circuits. The switching device is configured to adjust the first bit line signal and the second bit line signal. Each of the plurality of first memory circuits is configured to be programmed by a first possibility smaller than or approximately equal to fifty percent, when the switching device adjusts the first bit line signal to a first voltage level and adjusts the second bit line signal to a second voltage level. Each of the plurality of second memory circuits is configured to be programmed by a second possibility smaller than or approximately equal to fifty percent, when the switching device adjusts the second bit line signal to the first voltage level and adjusts the first bit line signal to the second voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    programming a first bit of a physical unclonable function into a first memory cell;
    programming a second bit of the physical unclonable function into a second memory cell different from the first memory cell; and
    generating, by a first memory circuit in the first memory cell, a first current indicating a logic value of the first bit,
    wherein programming the first bit comprises:
        turning on a first switch in the first memory circuit and at least one second switch in at least one second memory circuit in the first memory cell in response to a first bit line signal, to program one of the first memory circuit and the at least one second memory circuit while rest of the first memory circuit and the at least one second memory circuit is not programmed, according to the first bit line signal, and
    wherein programming the second bit comprises:
        receiving the first bit line signal by a first memory element in the second memory cell; and
        programming the first memory element by turning on a third switch coupled to the first memory element,
        wherein a control terminal of the third switch and a control terminal of the first switch are configured to receive the same control signal.

2. The method of claim 1, wherein generating the first current comprises:
    in response to the first memory circuit being programmed, generating the first current having a first current level; and
    in response to one of the at least one second memory circuit being programmed, generating the first current having a second current level different from the first current level.

3. The method of claim 1, wherein generating the first current comprises:
    during a reading operation, turning on the first switch and turning off the at least one second switch simultaneously.

4. The method of claim 1, wherein a possibility of the one of the first memory circuit and the at least one second memory circuit being programmed is approximately equal to one divided by a number of the first memory circuit and the at least one second memory circuit.

5. The method of claim 1, wherein applying the first bit line signal comprises:
    receiving the first bit line signal by a first terminal of a second memory element in the first memory circuit; and
    receiving the first bit line signal by a first terminal of a third memory element in one of the at least one second memory circuit,
    wherein a second terminal of the second memory element is coupled to a first terminal of the first switch, and a second terminal of the third memory element is coupled to a first terminal of one of the at least one second switch.

6. The method of claim 5, further comprising:
    providing a reference voltage signal to a second terminal of the first switch and a second terminal of the one of the at least one second switch, in response to programming the first bit or generating the first current.

7. The method of claim 1, further comprising:
    programming a third bit of the physical unclonable function into a third memory cell after the first memory cell is programmed; and
    generating, by a third memory circuit in the third memory cell, a second current indicating a logic value of the third bit, wherein programming the third bit comprises:
  turning on a fourth switch in the third memory circuit and at least one fifth switch in at least one fourth memory circuit in the third memory cell in response to a second bit line signal, to program one of the third memory circuit and the at least one fourth memory circuit while rest of the third memory circuit and the at least one fourth memory circuit is not programmed, according to the second bit line signal.

8. A memory device comprising:
  a first memory cell configured to store a first bit of a physical unclonable function, the first memory cell comprising:
    a first memory circuit configured to receive a first bit line signal; and
    a second memory circuit configured to receive the first bit line signal,
    wherein in response to the first memory circuit being programmed by the first bit line signal, the first bit has a first logic value,
    in response to the second memory circuit being programmed by the first bit line signal, the first bit has a second logic value different from the first logic value, and
    the first memory cell is further configured to provide a reference voltage signal to the first memory circuit according to a word line signal, and provide the reference voltage signal to the second memory circuit according to the word line signal.

9. The memory device of claim 8, wherein
the first memory circuit comprises:
  a first switch; and
  a first memory element, a first terminal of the first memory element configured to receive a first bit line signal, a second terminal of the first memory element coupled to a first terminal of the first switch, and
the second memory circuit comprises:
  a second switch; and
  a second memory element, a first terminal of the second memory element configured to receive the first bit line signal, a second terminal of the second memory element coupled to a first terminal of the second switch,
  wherein the first switch and the second switch are turned on when the first memory cell is programmed, and
  the first switch is turned on and the second switch is turned off when the first memory cell generates a current indicating the first bit.

10. The memory device of claim 8, wherein in response to the first bit line signal having a first voltage level, only one of the first memory circuit and the second memory circuit is programmed, and
  in response to the first bit line signal having a second voltage level different from the first voltage level, the first memory circuit is configured to generate a current indicating the first bit.

11. The memory device of claim 8, wherein the first memory circuit and the second memory circuit are configured to receive a first control signal and a second control signal, respectively,
  in response to each of the first control signal and the second control signal having a first voltage level, one of the first memory circuit and the second memory circuit is programmed, and
  in response to the first control signal having the first voltage level and the second control signal having a second voltage level different from the first voltage level, the first memory circuit is configured to generate a current indicating the first bit.

12. The memory device of claim 11, wherein
when each of the first control signal and the second control signal has the first voltage level, the first bit line signal has a third voltage level, and
when the first control signal has the first voltage level and the second control signal has the second voltage level, the first bit line signal has the first voltage level,
wherein the first voltage level is between the third voltage level and the second voltage level.

13. The memory device of claim 11, wherein the first memory cell further comprises:
  a first switch, a first terminal of the first switch coupled to the first memory circuit and the second memory circuit, a control terminal of the first switch is configured to receive the word line signal,
  wherein in response to each of the word line signal, the first control signal and the second control signal having the first voltage level, the first memory cell is programmed to store the first bit, and
  in response to each of the word line signal and the first control signal having the first voltage level, and the second control signal having the second voltage level, the first memory circuit configured to generate the current passing through the first switch.

14. The memory device of claim 13, further comprising:
  a third memory circuit configured to receive the first bit line signal, and coupled to the first terminal of the first switch,
  wherein in response to the third memory circuit being programmed by the first bit line signal, the first bit has the second logic value.

15. The memory device of claim 14, wherein the third memory circuit is configured to receive a third control signal,
  in response to each of the first control signal, the second control signal and the third control signal having the first voltage level, one of the first memory circuit the second memory circuit and the third memory circuit is programmed, and
  in response to the first control signal having the first voltage level and each of the second control signal and the third control signal having the second voltage level, the first memory circuit is configured to generate the current.

16. The memory device of claim 8, further comprising:
  a second memory cell configured to store a second bit of the physical unclonable function, the second memory cell comprising:
    a third memory circuit configured to receive a second bit line signal; and
    a fourth memory circuit configured to receive the second bit line signal,
    wherein in response to the third memory circuit being programmed by the second bit line signal, the second bit has the first logic value, and
    in response to the second memory circuit being programmed by the first bit line signal, the second bit has the second logic value.

17. A system, comprising:
  a first memory cell comprising a plurality of first memory circuits;
  a second memory cell comprising a plurality of second memory circuits;

a bit line decoder configured to provide a first bit line signal to each of the plurality of first memory circuits, and provide a second bit line signal to each of the plurality of second memory circuits; and a switching device configured to adjust the first bit line signal and the second bit line signal, wherein each of the plurality of first memory circuits is configured to be programmed by a first possibility smaller than or approximately equal to fifty percent, when the switching device adjusts the first bit line signal to a first voltage level and adjusts the second bit line signal to a second voltage level, and each of the plurality of second memory circuits is configured to be programmed by a second possibility smaller than or approximately equal to fifty percent, when the switching device adjusts the second bit line signal to the first voltage level and adjusts the first bit line signal to the second voltage level.

18. The system of claim 17, wherein the first possibility is approximately equal to one divided by a number of the plurality of first memory circuits, and the second possibility is approximately equal to one divided by a number of the plurality of second memory circuits.

19. The system of claim 18, further comprising:

a controlling decoder configured to provide a plurality of first control signals to the plurality of first memory circuits, respectively, and provide a plurality of second control signals to the plurality of second memory circuits, respectively, wherein when the first bit line signal has the first voltage level, each of the plurality of first control signals has a third voltage level between the first voltage level and the second voltage level, and when the switching device adjusts the first bit line signal to the third voltage level, one of the plurality of first control signals has the third voltage level, and each of other ones of the plurality of first control signals has the second voltage level.

20. The system of claim 19, further comprising:

a first switch configured to provide a reference voltage signal to each of the plurality of first memory circuits; and a second switch configured to provide the reference voltage signal to each of the plurality of second memory circuits, wherein the reference voltage signal has the second voltage level in response to the first memory cell comprising a n-type transistor receiving one of the plurality of first control signals, and the reference voltage signal has a fourth voltage level higher than the second voltage level in response to the first memory cell comprising a p-type transistor receiving one of the plurality of first control signals.

\* \* \* \* \*